US008253809B2

(12) United States Patent
Nishi

(10) Patent No.: US 8,253,809 B2
(45) Date of Patent: Aug. 28, 2012

(54) ANALOG-DIGITAL CONVERTER, ANALOG-DIGITAL CONVERSION METHOD, IMAGE PICKUP DEVICE, METHOD OF DRIVING THE SAME, AND CAMERA

(75) Inventor: Takafumi Nishi, Fukuoka (JP)

(73) Assignee: Sony Corporation, Tokyo (JP)

( * ) Notice: Subject to any disclaimer, the term of this patent is extended or adjusted under 35 U.S.C. 154(b) by 389 days.

(21) Appl. No.: 12/458,052

(22) Filed: Jun. 30, 2009

(65) Prior Publication Data

US 2010/0053399 A1    Mar. 4, 2010

(30) Foreign Application Priority Data

Aug. 27, 2008    (JP) ................................. 2008-217595
Dec. 24, 2008    (JP) ................................. 2008-327145

(51) Int. Cl.
  *H04N 9/04*      (2006.01)
  *H04N 3/14*      (2006.01)
  *H03M 1/00*      (2006.01)
  *H03M 1/66*      (2006.01)

(52) U.S. Cl. .................. 348/207.99; 348/294; 341/126; 341/144

(58) Field of Classification Search .......... 348/294–312; 341/126, 144, 151

See application file for complete search history.

(56) References Cited

U.S. PATENT DOCUMENTS

| | | | | |
|---|---|---|---|---|
| 5,877,715 A | * | 3/1999 | Gowda et al. | 341/122 |
| 5,982,318 A | * | 11/1999 | Yiannoulos | 341/155 |
| 7,109,906 B1 | * | 9/2006 | Zoso et al. | 341/155 |
| 7,113,212 B2 | | 9/2006 | Yonemoto et al. | |
| 7,623,173 B2 | * | 11/2009 | Nitta et al. | 348/302 |
| 7,629,914 B2 | * | 12/2009 | Muramatsu et al. | 341/164 |
| 7,804,535 B2 | * | 9/2010 | Muramatsu et al. | 348/273 |
| 2006/0012507 A1 | * | 1/2006 | Nitta et al. | 341/156 |
| 2006/0012698 A1 | * | 1/2006 | Nitta et al. | 348/308 |
| 2006/0013485 A1 | * | 1/2006 | Nitta et al. | 382/194 |
| 2006/0097902 A1 | * | 5/2006 | Muramatsu et al. | 341/155 |
| 2007/0080376 A1 | * | 4/2007 | Adachi et al. | 257/239 |
| 2007/0194962 A1 | * | 8/2007 | Asayama et al. | 341/144 |
| 2008/0042048 A1 | * | 2/2008 | Asayama et al. | 250/208.1 |
| 2008/0136948 A1 | * | 6/2008 | Muramatsu | 348/294 |
| 2008/0192127 A1 | * | 8/2008 | Sakai et al. | 348/222.1 |
| 2008/0224913 A1 | * | 9/2008 | Suzuki et al. | 341/155 |
| 2008/0252767 A1 | * | 10/2008 | Muramatsu et al. | 348/312 |
| 2009/0040352 A1 | * | 2/2009 | Kawaguchi | 348/308 |
| 2009/0109315 A1 | * | 4/2009 | Taura | 348/311 |
| 2009/0201187 A1 | * | 8/2009 | Asayama et al. | 341/145 |

FOREIGN PATENT DOCUMENTS

| | | |
|---|---|---|
| JP | 10-126697 | 5/1998 |
| JP | 2000-152082 | 5/2000 |
| JP | 2002-232291 | 8/2002 |

* cited by examiner

*Primary Examiner* — John Villecco
*Assistant Examiner* — Selam Gebriel
(74) *Attorney, Agent, or Firm* — Rader, Fishman & Grauer PLLC

(57) ABSTRACT

An analog-digital converter includes: comparators disposed to correspond to analog signals which are converted into digital signals and configured to compare a voltage value of the analog signal, which is converted into the digital signal, with a voltage value of a predetermined reference signal; counters disposed to correspond to the comparators and configured to count a count value at the time point when the comparison process of the corresponding comparator is finished; and a determiner configured to determine a time point when all the comparators finish their comparison processes.

13 Claims, 11 Drawing Sheets

ANALOG-DIGITAL CONVERTER, ANALOG-DIGITAL CONVERSION METHOD, IMAGE PICKUP DEVICE, METHOD OF DRIVING THE SAME, AND CAMERA

BACKGROUND OF THE INVENTION

1. Technical Field

The present invention relates to an analog-digital converter, an analog-digital conversion method, an image pickup device, a method of driving the image pickup device, and a camera. More particularly, the invention relates to an analog-digital converter and an analog-digital conversion method converting an analog value into a digital value by converting the analog signal with time, an image pickup device having the analog-digital converter, a method of driving the image pickup device, and a camera having the analog-digital converter.

2. Related Art

FIG. 13 is a diagram schematically illustrating a known CMOS image sensor, where the CMOS image sensor includes a pixel array section 202, a vertical scanning circuit 203, a column signal processor 204, and a horizontal scanning circuit 206 (for example, see JP-A-10-126697).

Here, the pixel array section 202 has a configuration in which plural pixels 201 each having a photoelectric conversion element are arranged in a matrix. The vertical scanning circuit 203 selects the pixels of the pixel array section 202 every row and controls a shutter operation or a reading operation of each pixel.

The column signal processor 204 reads signals from the pixel array section 202 every row and performs a predetermined signal process every column.

The horizontal scanning circuit 206 is configured to select the signals of the column signal processor every row and to guide the selected signals to a horizontal signal line 205. The signals from the horizontal signal line 205 are converted into an intended output format by a data signal processor (not shown).

Electrical signals corresponding to signal charges are sequentially read from the respective pixels 201 of the pixel array section 202. That is, a method of allowing an analog-to-digital converter (ADC) to convert the analog electric signals read from the pixels 201 into digital signals is generally employed.

An example of a known ADC is described now with reference to the drawings.

A known ADC 301 shown in FIG. 14 includes a counter clock supply line 302, a comparator 304, and a counter 305.

Here, a counter clock is supplied to the counter clock supply line 302. A digital-analog converter (DAC) 303 is connected to the counter clock supply line 302. The comparator 304 is connected to the DAC 303 and the counter 305 is connected to the comparator 304 and the counter clock supply line 302.

A counter clock (see "COUNTER CLOCK" in FIG. 15) is input to the DAC 303 via the counter clock supply line 302. The DAC is configured to output a ramp wave (analog signal) whose output value decreases at a constant ratio at a rising time or a falling time of the counter clock (see "DAC OUTPUT (RAMP WAVE)" in FIG. 15). The ramp wave output from the DAC 303 is commonly supplied to all the comparators 304.

A pixel output (see "PIXEL OUTPUT VALUE" in FIG. 15) which is an analog signal read from the pixel array section 202 (pixels 201) and the ramp wave are input to the comparators 304. The comparators are configured to output a high-level (H-level) signal when the pixel output and the ramp wave satisfy a relation of "(ramp wave)>(pixel output)" and to output a low-level (L-level) signal when the pixel output and the ramp wave satisfy a relation of "(ramp wave)<(pixel output)" (see "COMPARATOR OUTPUT" in FIG. 15).

The counter 305 is a DDR (Double Data Rate) counter and is configured to perform a counting operation at both the rising time and the falling time of the input counter clock (see "COUNTER OUTPUT" in FIG. 15). The counter 305 stops the counting operation at a time point when the output signal of the comparator 304 becomes a L level.

The ADC having the above-mentioned configuration stops the count at a time point when the output of the comparator is inverted from the H-level signal to the L-level signal, that is, at a time point when the ramp wave becomes smaller than the pixel output. The ADC outputs the counted value as a digital value of the pixel output at that time and can convert the analog signal (pixel output) into the digital value (counted value) by converting the pixel output (electrical signal) with time.

Specific description is made now with reference to FIG. 16. Here, reference sign V represents the pixel output (analog value) and reference sign L represents the waveform of the ramp wave.

In the ADC having the above-mentioned configuration, the count value of an intersection P (at the time point when the output values are equal) of the ramp wave output from the DAC and a reset level is determined to convert the reset level of the pixels into a digital value. The count value of an intersection D (at the time point when the output values are equal) of the ramp wave output from the DAC and a signal level is determined to convert the signal level of the pixels into a digital value.

In this way, the pixel output (electrical signal) is converted with time and the analog value (pixel output) is converted into a digital value (count value).

Here, in the known ADC, the output waveform (ramp wave) of the DAC does not depend on the pixel output but is always constant. That is, even at any pixel output value, a period of time (a P-phase reading period) necessary for converting the reset level into the digital value and a period of time (D-phase reading period) necessary for converting the signal level into the digital value are constant.

SUMMARY OF THE INVENTION

Since the pixel output (electrical signals) of pixels in an image not the same in the horizontal direction are different by columns, it is necessary to scan using a ramp wave capable of coping with the pixel outputs of all the columns.

However, an idle scanning period after converting the analog values (pixel outputs) of all the columns into digital values (count values) is clearly waste. Specifically, when the pixel output Va of the column A, the pixel output Vb of the column B, and the pixel output Vc of the column C are converted into digital values, the idle scanning period (period indicated by reference sign X in FIG. 17) after the ramp wave L intersects Va, Vb, and Vc can be apparently said to be waste.

Therefore, there is a need for providing an ADC capable of reducing the idle scanning of the ramp wave, a conversion method thereof, an image pickup device having the ADC, a driving method thereof, and a camera having the ADC.

According to an embodiment of the invention, there is provided an analog-digital converter including: comparators disposed to correspond to analog signals which are converted into digital signals and configured to compare a voltage value of the analog signal, which is converted into the digital signal, with a voltage value of a predetermined reference signal; counters disposed to correspond to the respective comparators and configured to count a count value at the time point when the comparison process of the corresponding comparator is finished; and a determiner configured to determine a time point when all the comparators finish their comparison processes.

According to another embodiment of the invention, there is provided an image pickup device including: a pixel array section in which pixels accumulating an analog signal corresponding to incident light are arranged in a matrix; comparators disposed to correspond to the pixels to be subjected to a reading operation and configured to compare a voltage value of the analog signal generated from the pixel subjected to the reading operation with a voltage value of a predetermined reference signal; counters disposed to correspond to the respective comparators and configured to count a count value at the time point when the comparison process of the corresponding comparator is finished; and a determiner configured to determine a time point when all the comparators finish their comparison processes.

According to another embodiment of the invention, there is provided a camera including: a pixel array section in which pixels accumulating an analog signal corresponding to incident light are arranged in a matrix; an optical system guiding the incident light to the pixel array section; comparators disposed to correspond to the pixels to be subjected to a reading operation and configured to compare a voltage value of the analog signal generated from the pixel subjected to the reading operation with a voltage value of a predetermined reference signal; counters disposed to correspond to the respective comparators and configured to count a count value at the time point when the comparison process of the corresponding comparator is finished; and a determiner configured to determine a time point when all the comparators finish their comparison processes.

Here, by allowing the determiner to determine the time point when all the comparators finish the comparison process, it is possible to determine the time point when all the analog-digital conversion processes are finished.

According to another embodiment of the invention, there is provided an analog-digital conversion method including the steps of: comparing voltage values of analog signals, which are converted into digital signals, with a predetermined reference signal; counting a count value at a time point when each comparison process is finished; and determining a time point when all the comparison processes are finished.

According to another embodiment of the invention, there is provided a method of driving an image pickup device, including the steps of: accumulating analog signals corresponding to incident light in pixels arranged in a matrix; comparing voltage values of the analog signals, which are generated from the pixels subjected to a reading operation, with a predetermined reference signal; counting a count value at a time point when each comparison process is finished; and determining a time point when all the comparison processes are finished.

Here, by performing the step of determining the time point when all the comparison processes are finished, it is possible to determine the time point when all the analog-digital conversion processes are finished.

In the ADC, the driving method thereof, the image pickup device, the driving method thereof, and the camera employing the invention, it is possible to reduce the idle scanning period of the ramp wave.

DESCRIPTION OF PREFERRED EMBODIMENTS

Hereinafter, preferred embodiments (hereinafter, referred to as "embodiments") of the invention will be described. The description will be made in the following order.

Figure 1:
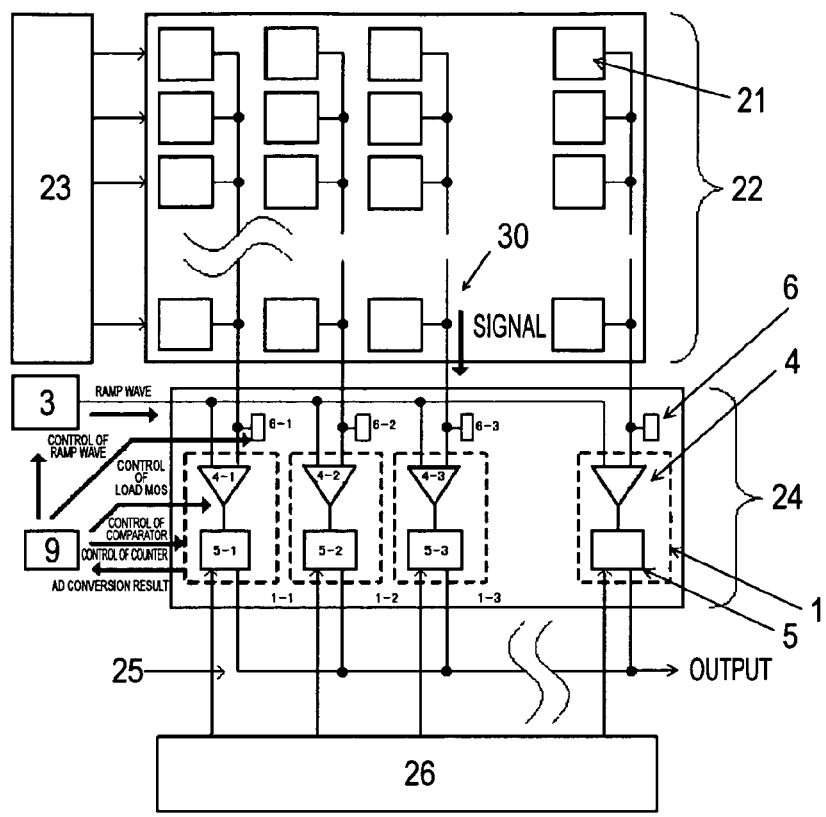
FIG. 1 is a diagram schematically illustrating a CMOS image sensor which is an example of an image pickup device according to a first embodiment of the invention.

1. First Embodiment
2. Modified Example 1 of First Embodiment (a frame rate is fixed)
3. Modified Example 2 of First Embodiment (a ramp wave is not reset)
4. Modified Example 3 of First Embodiment (up-count)
5. Second Embodiment
6. Modified Example of Second Embodiment
7. Third Embodiment 1. First Embodiment Image Pickup Device FIG. 1 is a diagram schematically illustrating a CMOS image sensor which is an example of an image pickup device according to a first embodiment of the invention. The CMOS image sensor roughly includes a pixel array section 22, a vertical scanning circuit 23, a column signal processor 24, a determination circuit 9, and a horizontal scanning circuit 26.
Pixel Array Section Here, the pixel array section 22 includes pixels 21 each of which has a photoelectric conversion element and which are arranged in a matrix. The vertical scanning circuit 23 selects each pixel of the pixel array section 22 row by row and controls a shutter operation or a reading operation of the selected pixels.

Figure 2:
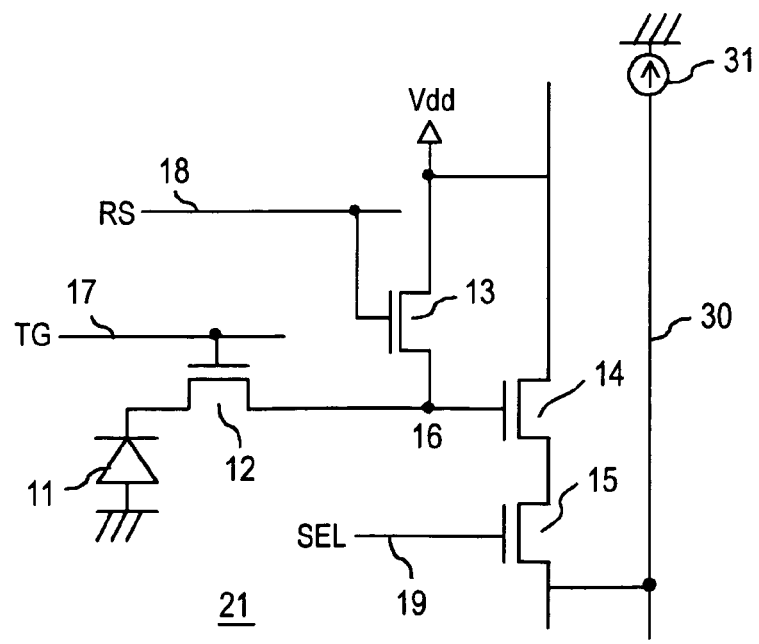
FIG. 2 is a diagram schematically illustrating a pixel array section.

The respective pixels 21 of the pixel array section have a circuit configuration including four transistors of a transfer transistor 12, a reset transistor 13, an amplification transistor 14, and a selection transistor 15 in addition to a photoelectric conversion element 11, as shown in FIG. 2. Here, a circuit example where n-channel MOS transistors are used as the transistors 12 to 15 is shown. For example, a photo diode is used as the photoelectric conversion element.

Here, the transfer transistor 12 is connected between the cathode of the photo diode 11 and a floating diffusion portion (FD portion) 16 and the gate electrode thereof is connected to a transfer control line 17 to which a transfer gate pulse TG is applied. The drain electrode of the reset transistor 13 is connected to a voltage source Vdd, the source electrode thereof is connected to the FD portion 16, and the gate electrode thereof is connected to a reset control line 18 to which a reset pulse RS is applied.

The gate electrode of the amplification transistor 14 is connected to the FD portion 16, the drain electrode thereof is connected to the voltage source Vdd, and the source electrode thereof is connected to the drain electrode of the selection. transistor 15. The gate electrode of the selection transistor 15 is connected to a selection control line 19 to which a selection pulse SEL is applied and the source electrode thereof is connected to a vertical signal line 30. The vertical signal line 30 is connected to a constant current source 31 supplying constant current to the vertical signal line and the column signal processor 24.

Figure 3:
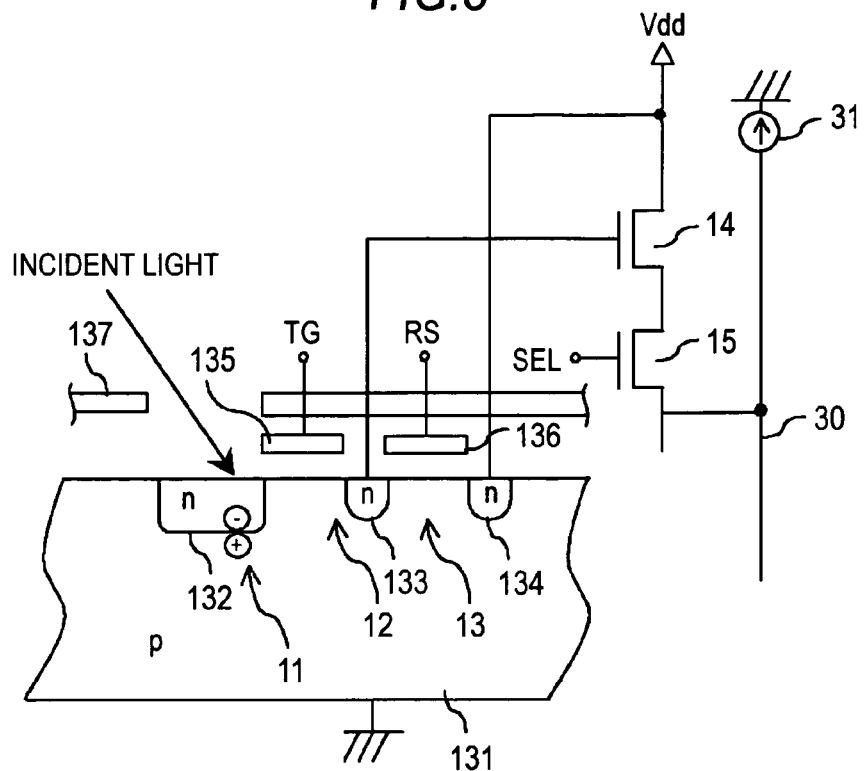
FIG. 3 is a diagram schematically illustrating a sectional structure of a pixel portion other than an amplification transistor and a selection transistor.

FIG. 3 is a diagram schematically illustrating a sectional structure of a pixel portion other than the amplification transistor 14 and the selection transistor 15.

n-Type diffusion regions 132, 133, and 134 are formed in a surface layer portion of a p-type substrate 131. Above the p-type substrate 131, a gate electrode 135 is formed above the area between the n-type diffusion region 132 and the n-type diffusion region 133 via a gate oxide film ($SiO_2$) not shown therebetween and a gate electrode 136 is formed above the area between the n-type diffusion region 133 and the n-type diffusion region 134 via a gate oxide film ($SiO_2$) not shown therebetween.

In the correspondence to FIG. 2, the photo diode 11 is formed by a p-n junction of the p-type substrate 131 and the n-type diffusion region 132. The transfer transistor 12 is formed by the n-type diffusion region 132, the n-type diffusion region 133, and the gate electrode 135 therebetween. The reset transistor 13 is formed by the n-type diffusion region 133, the n-type diffusion region 134, and the gate electrode 136 therebetween.

The n-type diffusion region 133 serves as the FD portion 16 and is electrically connected to the gate electrode of the amplification transistor 14. The n-type diffusion region 134 serving as the drain region of the reset transistor 13 is supplied with the source potential Vdd. The top surface of the p-type substrate 131 except for the photo diode 11 is covered with a light-blocking layer 137.

A circuit operation of the pixel 21 will be described on the basis of the sectional view of FIG. 3 using the waveform diagram shown in FIG. 4.

Figure 4:
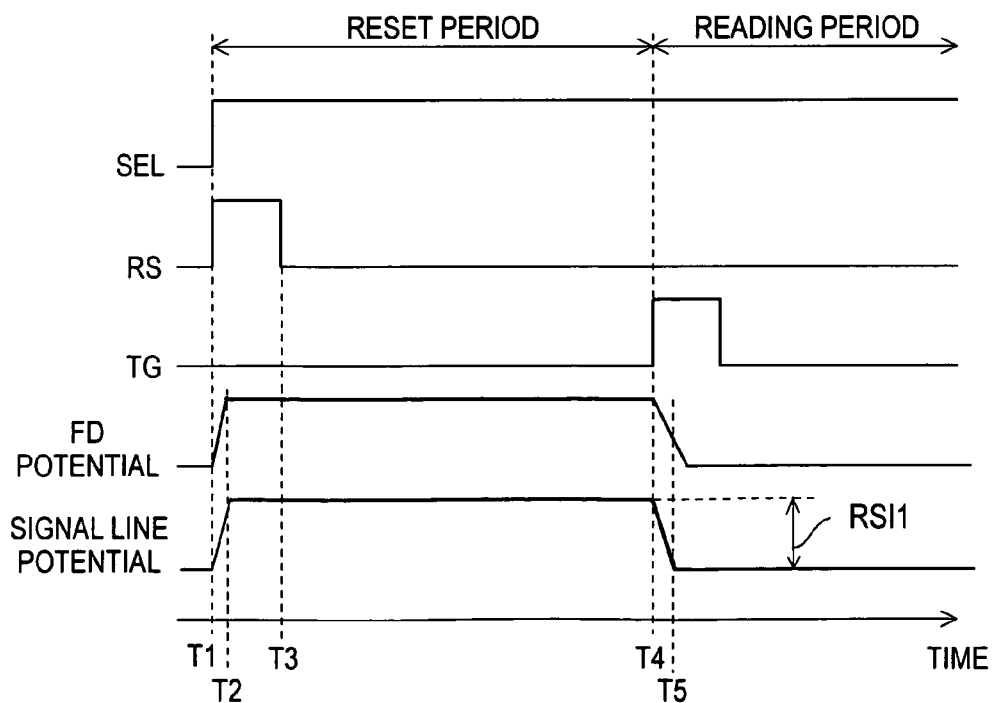
FIG. 4 is a diagram schematically illustrating a circuit operation of a pixel.

As shown in FIG. 3, when light is radiated to the photo diode 11, pairs of electron (−) and hole (+) are induced depending on the intensity of light (photoelectric conversion) In FIG. 4, the selection pulse SEL is applied to the gate electrode of the selection transistor 15 at time T1 and the reset pulse RS is applied to the gate electrode of the reset transistor 13 at the same time. As a result, the reset transistor 13 is turned on and the FD portion 16 is reset to the source potential Vdd at time T2.

When the FD portion 16 is reset, the potential of the FD portion 16 at the time of reset is output as a reset level to the signal line 30 via the amplification transistor 14. The reset level corresponds to the specific noise component of the pixel 21. The reset pulse RS is in an active state ("H" level) only in a predetermined period of time (times T1 to T3). The FD portion 16 maintains the reset state even after the reset pulse RS is changed to a non-active state ("L" level) from the active state. The period of time in the reset state is a reset period.

Then, with the selection signal SEL in the active state, the transfer gate pulse TG is applied to the gate electrode of the transfer transistor 12 at time T4. Then, the transfer transistor 12 is turned on and the accumulated signal charges are photoelectrically converted by the photo diode 11 and are transferred to the FD portion 16. As a result, the potential of the FD portion 16 starts change depending on the amount of signal charges (times T4 to T5). The potential of the FD portion 16 at this time is output as a signal level to the signal line 30 via the amplification transistor 14 (signal reading period). A difference RSI1 between the signal level and the reset level is a pure pixel signal level from which the noise component is removed.

In general, the amount of charges accumulated in the photo diode 11 is greater in imaging a bright object than in imaging a dark object. Accordingly, the level difference RSI1 in the vertical signal line 30 increases.

Electrical signals corresponding to the signal charges are sequentially read from the respective pixels 21 of the pixel array section 22. As described above, a method of allowing the ADC to convert the analog electrical signals read from the respective pixels 21 into digital signals and outputting the digital signals to the outside is generally employed. JP-A-2000-152082 and JP-A-2002-232291, for example, disclose that the ADC converts the analog electrical signals into the digital signals and outputs the digital signals to the outside.
Column Signal Processor The column signal processor 24 reads signals from the pixel array section 22 row by row and performs a predetermined signal process column by column. An example of the signal process includes a CDS process (a process of removing a fixed pattern noise due to a difference in threshold value of pixel transistors), an AGC (Auto Gain Control) process, and an analog-digital conversion process and the like.

Here, the analog-digital conversion process is performed by the ADC 1 disposed to correspond to the vertical signal lines 30. Each ADC 1 includes a comparator 4 and a counter 5. A MOS transistor 6 serving as a load is connected to each of the respective vertical signal lines 30.

Here, a counter clock supply line (not shown) is supplied with a counter clock and the DAC 3 is connected to the counter clock supply line. The comparator 4 is connected to the DAC 3 and the counter 5 is connected to the comparator 4 and the counter clock supply line.

The counter clock is input to the DAC 3 via the counter clock supply line. At the rising time and the falling time of the counter clock, a down-count ramp wave (analog signal) whose output value decreases at a constant ratio is output from the DAC. Specifically, the down-count ramp wave decreasing at a constant ratio from a fixed initial voltage value (ramp wave start voltage value) can be output. The ramp waves output from the DAC 3 is commonly supplied to all the comparators 4.

A pixel output which is an analog signal read from the pixel array section 22 (pixel 21) and the ramp wave are input to the comparator 4. The comparator outputs a H-level signal when the pixel output and the ramp wave satisfy the relation of "(ramp wave)>(pixel output)" and outputs a L-level signal when the pixel output and the ramp wave satisfy the relation of "(ramp wave)<(pixel output)."

The counter 5 is a DDR counter and is configured to count at both the rising time and the falling time of the input counter clock. The counter 5 is configured to stop the count at the time point when the output signal of the comparator 4 is changed to the L level.

The column signal processor 24 having the above-mentioned configuration stops the count at the time point when the output of the comparator 4 is inverted from the H-level signal to the L-level signal, that is, when the ramp wave is smaller than the pixel output. The column signal processor outputs the count value at that time as the digital value of the pixel output to convert the pixel output (electrical signal) with time, thereby converting the analog signal (pixel output) into the digital value (count value).

Determination Circuit

The determination circuit 9 is configured to determine the time point when the outputs of all the comparators 5 are inverted from the H-level signal to the L-level signal. Specifically, the determination circuit takes a logical product of the outputs of all the comparators 5, thereby detecting the time point when the digital conversion of all the analog signals to be converted into digital signals is finished.

When the time point when the digital conversion of all the analog signals is finished is determined by the determination circuit 9, the analog-digital conversion process is stopped. The time point when the analog-digital conversion process is stopped may be just after all the analog-digital conversion processes are finished by the determination circuit or in a predetermined time after the analog-digital conversion processes are finished.

Horizontal Scanning Circuit

The horizontal scanning circuit 26 is configured to select one of the signals from the column signal processor 24 and to guide the selected signal to the horizontal signal line 25 and allows a data signal processor (not shown) to convert the signal from the horizontal signal line 25 into an intended output format.

Method of Driving Image Pickup Device

Figure 5:
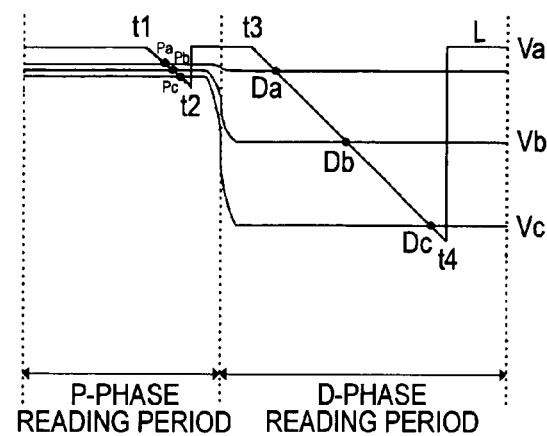
FIG. 5 is a diagram schematically illustrating an example of an analog-digital conversion method according to the first embodiment of the invention.

An analog-digital conversion method in the CMOS image sensor according to the embodiment of the invention will be described now with reference to FIG. 5. That is, an example of the analog-digital conversion method according to an embodiment of the invention and an example of a method of driving the image pickup device according to an embodiment of the invention will be described. Here, reference sign Va in FIG. 5 represents the pixel output of column A, reference sign Vb represents the pixel output of column B, reference sign Vc represents the pixel output of column C, and reference sign L in the drawing represents a waveform of the ramp wave. All of Va, Vb, and Vc are shown in FIG. 5 for the purpose of convenient explanation, but actually the digital conversion of Va is performed by the ADC 1 corresponding to column A, the digital conversion of Vb is performed by the ADC 1 corresponding to column B, and the digital conversion of Vc is performed by the ADC 1 corresponding to column C.

In the example of the method of driving the image pickup device according to the embodiment of the invention, the count value of the intersection (at the time when the output values are equal) of the reset level Pa and the ramp wave L is determined to convert the reset level Pa of the pixel output value Va into a digital value. That is, the count is started with a decrease of the ramp wave L and the count value of the intersection of the reset level Pa of the pixel output value Va and the ramp wave L is determined as the count value (digital value) of the reset level Pa of the pixel output value Va.

Specifically, at the time indicated by reference sign t1 in FIG. 5, the count is started with the decrease of the ramp wave L. Then, the count is stopped at the intersection (point indicated by reference sign Pa) of the reset level Pa of the pixel output value Va and the ramp wave L and the count value at that time is determined as the count value (digital value) of the reset level Pa of the pixel output value Va.

Similarly to Va, the count value of the intersection (at the time when the output values are equal) of the reset level Pb and the ramp wave L is determined to convert the reset level Pb of the pixel output value Vb into a digital value. That is, the count is started with a decrease of the ramp wave L and the count value of the intersection of the reset level Pb of the pixel output value Vb and the ramp wave L is determined as the count value (digital value) of the reset level Pb of the pixel output value Vb.

Specifically, at the time indicated by reference sign t1 in FIG. 5, the count is started with the decrease of the ramp wave L. Then, the count is stopped at the intersection (point indicated by reference sign Pb) of the reset level Pb of the pixel output value Vb and the ramp wave L and the count value at that time is determined as the count value (digital value) of the reset level Pb of the pixel output value Vb.

Similarly to Va and Vb, the count value of the intersection (at the time when the output values are equal) of the reset level Pc and the ramp wave L is determined to convert the reset level Pc of the pixel output value Vc into a digital value. That is, the count is started with a decrease of the ramp wave L and the count value of the intersection of the reset level Pc of the pixel output value Vc and the ramp wave L is determined as the count value (digital value) of the reset level Pc of the pixel output value Vc.

Specifically, at the time indicated by reference sign t1 in FIG. 5, the count is started with the decrease of the ramp wave L. Then, the count is stopped at the intersection (point indicated by reference sign Pc) of the reset level Pc of the pixel output value Vc and the ramp wave L and the count value at that time is determined as the count value (digital value) of the reset level Pc of the pixel output value Vc.

When the determination circuit detects that the digital conversion of the reset levels of all the pixel output values is finished, the processes of converting the reset levels into digital values are stopped and the P-phase reading period for converting the reset levels into digital values is intercepted and stopped. Specifically, the processes of converting the reset levels into digital values are stopped at the time indicated by reference sign t2 in FIG. 5.

Subsequently, the count value of the intersection (at the time when the output values are equal) of the signal level Da and the ramp wave L is determined to convert the signal level Da of the pixel output value Va into a digital value. That is, the count is started with a decrease of the ramp wave L and the count value of the intersection of the signal level Da of the pixel output value Va and the ramp wave L is determined as the count value (digital value) of the signal level Da of the pixel output value Va.

Specifically, at the time indicated by reference sign t3 in FIG. 5, the count is started with the decrease of the ramp wave L. Then, the count is stopped at the intersection (point indicated by reference sign Da) of the signal level Da of the pixel output value Va and the ramp wave L and the count value at that time is determined as the count value (digital value) of the signal level Da of the pixel output value Va.

Similarly to Va, the count value of the intersection (at the time when the output values are equal) of the signal level Db and the ramp wave L is determined to convert the signal level Db of the pixel output value Vb into a digital value. That is, the count is started with a decrease of the ramp wave L and the count value of the intersection of the signal level Db of the pixel output value Vb and the ramp wave L is determined as the count value (digital value) of the signal level Db of the pixel output value Vb.

Specifically, at the time indicated by reference sign t3 in FIG. 5, the count is started with the decrease of the ramp wave L. Then, the count is stopped at the intersection (point indicated by reference sign Db) of the signal level Db of the pixel output value Vb and the ramp wave L and the count value at that time is determined as the count value (digital value) of the signal level Db of the pixel output value Vb.

Similarly to Va and Vb, the count value of the intersection (at the time when the output values are equal) of the signal level Dc and the ramp wave L is determined to convert the signal level Dc of the pixel output value Vc into a digital value. That is, the count is started with a decrease of the ramp wave L and the count value of the intersection of the signal level Dc of the pixel output value Vc and the ramp wave L is determined as the count value (digital value) of the signal level Dc of the pixel output value Vc.

Specifically, at the time indicated by reference sign t3 in FIG. 5, the count is started with the decrease of the ramp wave L. Then, the count is stopped at the intersection (point indicated by reference sign Dc) of the signal level Dc of the pixel output value Vc and the ramp wave L and the count value at that time is determined as the count value (digital value) of the signal level Dc of the pixel output value Vc.

When the determination circuit detects that the digital conversion of the signal levels of all the pixel output values is finished, the processes of converting the signal levels into digital values are stopped and the D-phase reading period is intercepted and stopped. Specifically, the processes of converting the signal levels into digital values are stopped at the time indicated by reference sign t4 in FIG. 5.

In the CMOS image sensor according to the embodiment of the invention, since the P-phase reading period is stopped at the time point when the digital conversion of the reset levels of all the pixel output values is finished, it is possible to reduce the P-phase reading period and thus to reduce the analog-digital conversion time. Similarly, in the CMOS image sensor according to the embodiment of the invention, since the D-phase reading period is stopped at the time point when the digital conversion of the signal levels of all the pixel output values is finished, it is possible to reduce the D-phase reading period and thus to reduce the analog-digital conversion time.

The reading period for the same number of pixels is also reduced due to the reduction in analog-digital conversion period, thereby improving the frame rate. It is also possible to reduce the power consumption necessary for reading the same number of pixels.

2. Modified Example 1 of First Embodiment

In the first embodiment, the case where the P-phase reading period is stopped at the time point when the digital conversion of the reset levels of all the pixel output values is finished and the D-phase reading period for converting the signal level of the pixel output value into a digital value is started is exemplified. However, it is not necessary to change the frame rate. When it is intended to fix the frame rate, it is not necessary to stop the P-phase reading period even if the digital conversion of the reset levels of all the pixel output values is finished.

Figure 6:
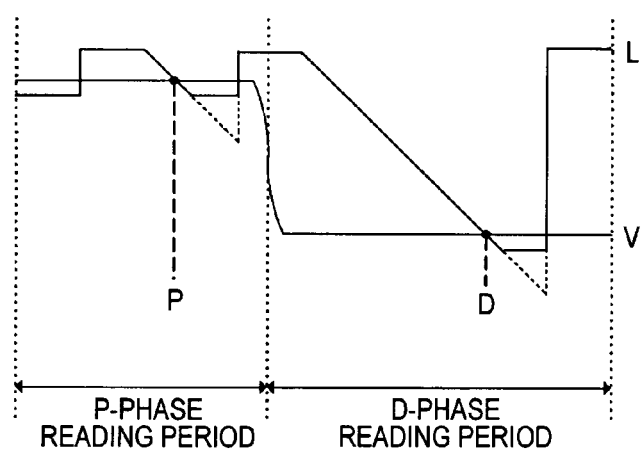
FIG. 6 is a diagram schematically illustrating Modified Example 1 of the first embodiment of the invention.

For example, as shown in FIG. 6, it is possible to reduce the power consumption by stopping the operations of the DAC 3, the counter 5, the comparator 4, and the load MOS 6 at the time point when the digital conversion of the reset levels of all the pixel output values is finished and maintaining the P-phase reading period in this state. Similarly, as shown in FIG. 6, it is possible to reduce the power consumption by stopping the operations of the DAC 3, the counter 5, the comparator 4, and the load MOS 6 at the time point when the digital conversion of the signal levels of all the pixel output values is finished and maintaining the D-phase reading period in this state.

3. Modified Example 2 of First Embodiment

Figure 7A:
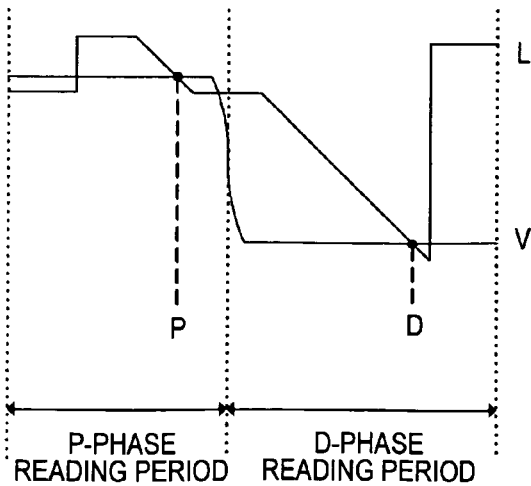
FIG. 7A is a diagram (1) schematically illustrating Modified Example 2 of the first embodiment of the invention.

In the first embodiment, the case where the ramp wave L decreases from the initial voltage value in the D-phase reading period is exemplified. However, the signal level of the pixel output value is generally greater than the reset level of the pixel output value. Accordingly, as shown in FIG. 7A, in the D-phase reading period, the ramp wave L may be made to continuously decrease from the output value of the ramp wave L when the P-phase reading period is stopped. By employing such a driving method, it is possible to further reduce the D-phase reading period.

Figure 7B:
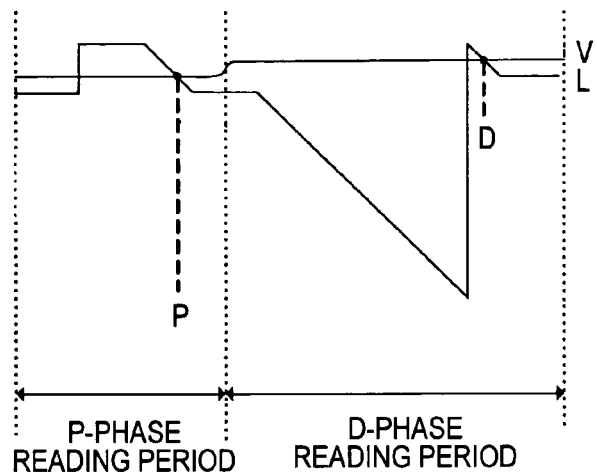
FIG. 7B is a diagram (2) schematically illustrating Modified Example 2 of the first embodiment of the invention.

Here, as described above, the signal level of the pixel output value is generally greater than the reset level of the pixel output value, but it may be considered that the signal level of the pixel output value is smaller than the reset level of the pixel output value. In this case, as shown in FIG. 7B, the ramp wave L may be made to decrease from the initial voltage value after the ramp wave L fully decreases in the D-phase reading period.

4. Modified Example 3 of First Embodiment

In the first embodiment, the case where the down-count ramp wave is used is exemplified, but the invention is not limited to the down-count and an up-count ramp wave may be used.

5. Second Embodiment

In the first embodiment, it is possible to improve the frame rate by optimizing the end points of the P-phase reading period and the D-phase reading period. In a second embodiment of the invention, it is possible to further improve the frame rate by optimizing the end points of the P-phase reading period and the D-phase reading period and optimizing the initial voltage value of the ramp wave L.

Image Pickup Device

Figure 8:
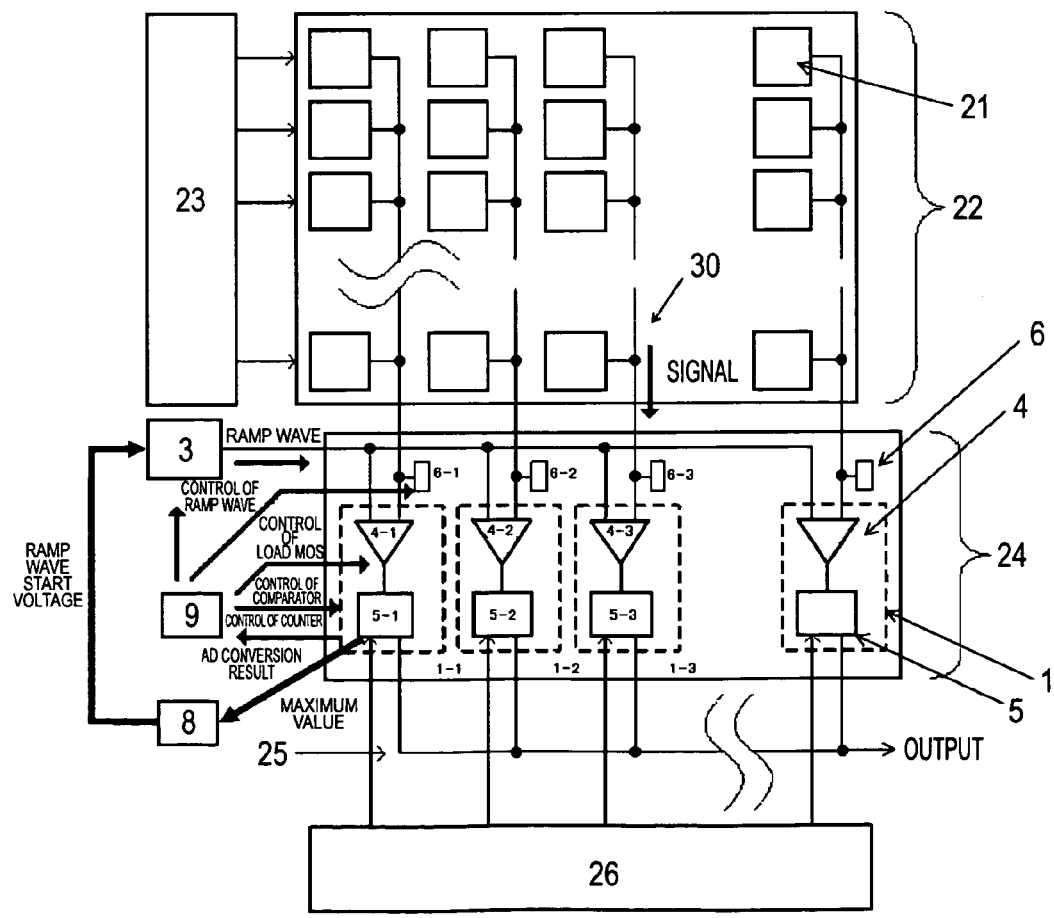
FIG. 8 is a diagram schematically illustrating a CMOS image sensor which is an example of an image pickup device according to a second embodiment of the invention.

FIG. 8 is a diagram schematically illustrating a CMOS image sensor which is an example of an image pickup device according to the second embodiment of the invention. The CMOS image sensor has a configuration in which a memory 8 is added to the CMOS image sensor according to the first embodiment.

Memory

Here, the memory 8 is configured to store the voltage value of the analog signal representing the maximum voltage value among the analog signals converted into digital signals at a previous time by the ADCs.

A down-count ramp wave using a voltage value higher by a predetermined voltage than the voltage value stored in the memory 8 as an initial voltage value (ramp wave start voltage value) and decreasing at a constant ratio from the initial voltage value is output from the DAC 3.

Ramp Wave

Figure 9:
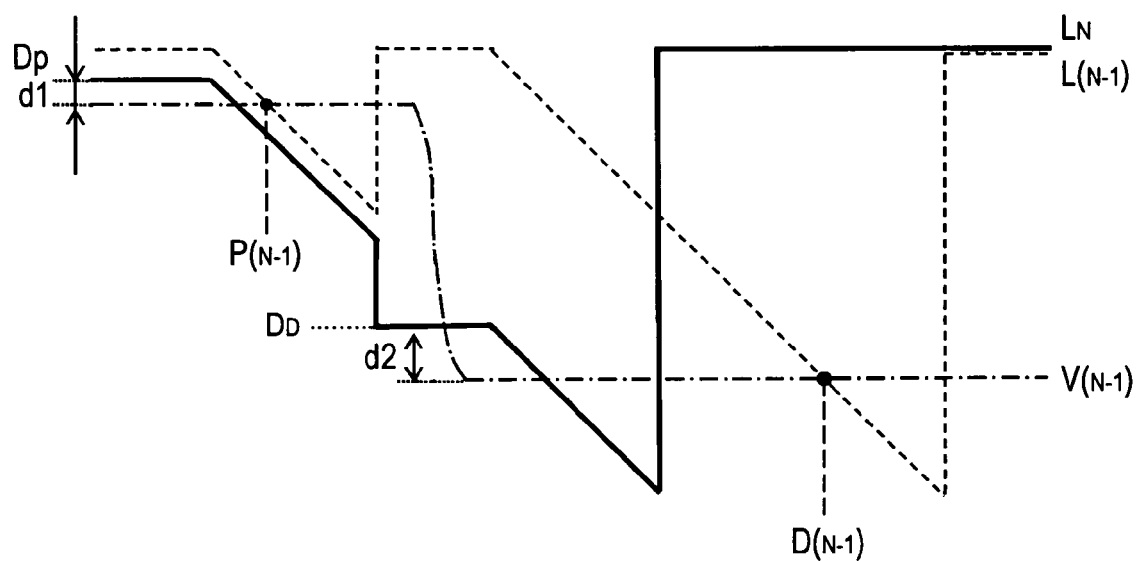
FIG. 9 is a diagram schematically illustrating a ramp wave output from a DAC of the CMOS image sensor according to the second embodiment of the invention.

The ramp wave output from the DAC 3 of the CMOS image sensor according to the second embodiment of the invention will be described now with reference to FIG. 9. here, reference sign $V_{(N-1)}$ in FIG. 9 represents the pixel output value indicating the maximum voltage value among the pixel output values (analog values) of the (N−1)-th row and is, for example, a pixel output value corresponding to the pixel output value Va shown in FIG. 5 according to the first embodiment. Reference sign $L_{(N-1)}$ represents a waveform of the ramp wave at the time of reading the pixels in the (N−1)-th row and reference sign $L_N$ in the drawing represents a waveform of the ramp wave at the time of reading the pixels in the N-th row.

The output value of the reset level of the pixel output value $V_{(N-1)}$ of the (N−1)-th row is represented by $P_{(N-1)}$ and the output value of the signal level of the pixel output value $V_{(N-1)}$ of the (N−1)-th row is represented by $D_{(N-1)}$.

In the following description, a case where the signal charges generated from the pixels in the (N−1)-th row are converted into digital values and then the signal charges generated from the pixels in the N-th row are converted into digital values will be exemplified. That is, a case where the signal charge generated from the pixels in the (N−1)-th row are converted into digital values at a previous time and the signal charges generated from the pixels in the N-th row are converted into digital values at a subsequent time is exemplified.

In the DAC having the above-mentioned configuration, the output value $P_{(N-1)}$ of the reset level and the output value $D_{(N-1)}$ of the signal level are stored in the memory 8 and the ramp wave $L_N$ at the time of reading the pixels in the N-th row is generated on the basis of $P_{(N-1)}$ and $D_{(N-1)}$ stored in the memory 8.

Specifically, as shown in FIG. 9, a ramp wave using a voltage value, which is greater by a predetermined voltage d1 than $P_{(N-1)}$, as the initial voltage $D_P$ and starting the down-count from the initial voltage value $D_P$ is generated. In this way, the ramp wave $L_N$ in the period (P-phase reading period) for converting the output value of the reset level of the pixel output value of the N-th row into a digital value is generated. A ramp wave using a voltage value, which is greater by a predetermined voltage d2 than $D_{(N-1)}$, as the initial voltage $D_D$ and starting the down-count from the initial voltage value $D_D$ is generated. In this way, the ramp wave $L_N$ in the period (D-phase reading period) for converting the signal level of the pixel output value of the N-th row into a digital value is generated.

Here, the "predetermined voltage d1" is a voltage value generally considered as a difference in reset level between the analog signal converted into the digital value in the previous time and the analog signal converted into the digital value at the subsequent time. The initial voltage value $D_P$ is determined by adding the predetermined voltage d1 to $P_{(N-1)}$. Therefore, the analog signal converted into the digital value at the subsequent time is considered to be equal to or less than the initial voltage value $D_P$.

Similarly, the "predetermined voltage d2" is a voltage value generally considered as a difference in signal level between the analog signal converted into the digital value in the previous time and the analog signal converted into the digital value at the subsequent time. The initial voltage value $D_D$ is determined by adding the predetermined voltage d2 to $D_{(N-1)}$. Therefore, the analog signal converted into the digital value at the subsequent time is considered to be equal to or less than the initial voltage value $D_D$.

Method of Driving Image Pickup Device

Except that the ramp wave $L_N$ generated in this way is used, this driving method is similar to the method of driving the image pickup device according to the first embodiment and thus the method of driving the image pickup device is not described here.

The CMOS image sensor according to the embodiment of the invention, since the initial voltage value is determined from the pixel output value of the (N−1)-th row in generating the ramp wave $L_N$ used at the time of converting the pixel output value of the N-th row into a digital value, it is possible to further reduce the analog-digital conversion period.

That is, by predicting a range of the pixel output value of the N-th row from the pixel output value of the (N−1)-th row and generating the ramp wave $L_N$ for scanning the predicted range, it is possible to further reduce the analog-digital conversion period.

Figure 10A:
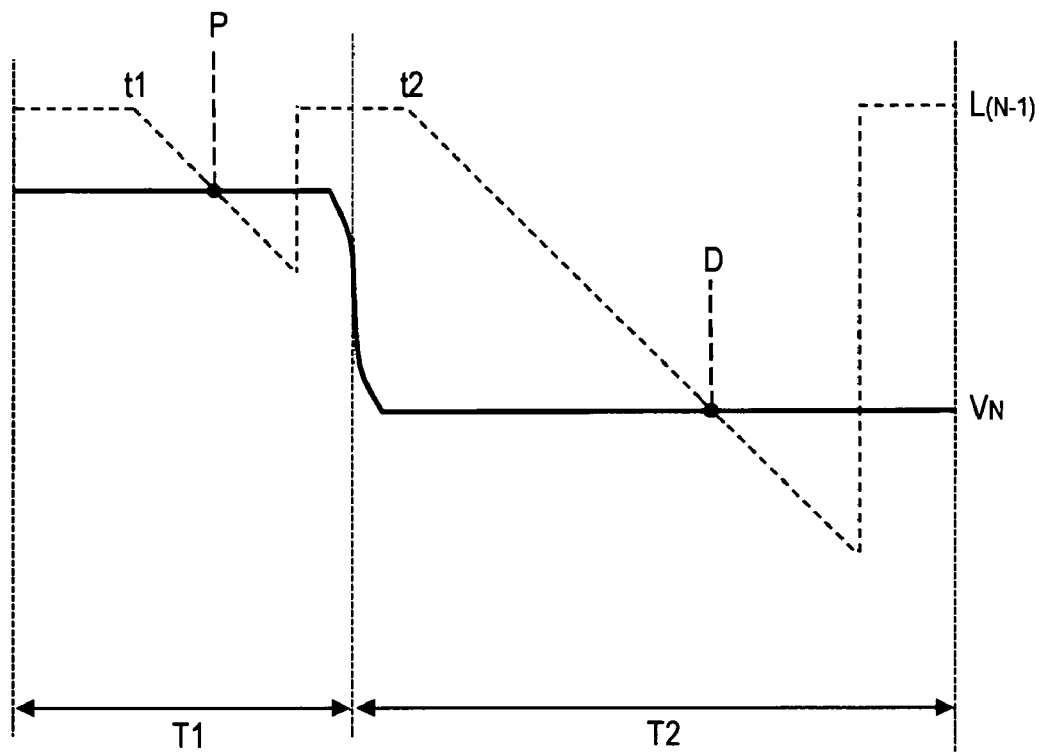
FIGS. 10A and 10B are diagrams schematically illustrating a reduction of a P-phase reading period and a D-phase reading period.

Here, when the ramp wave $L_{(N-1)}$ is used to convert the pixel output value $V_N$ of the N-th row into a digital value, the P-phase reading period indicated by reference sign T1 in FIG. 10A is necessary for determining the count value of the reset level of the pixel output value $V_N$. The D-phase reading period indicated by reference sign T2 in FIG. 10A is necessary for determining the count value of the signal level of the pixel output value $V_N$.

"When the ramp wave $L_{(N-1)}$ is used to convert the pixel output value $V_N$ of the N-th row into a digital value" means a case where the range of the pixel output value of the N-th row is not predicted from the pixel output value of the (N−1)-th row.

Figure 10B:
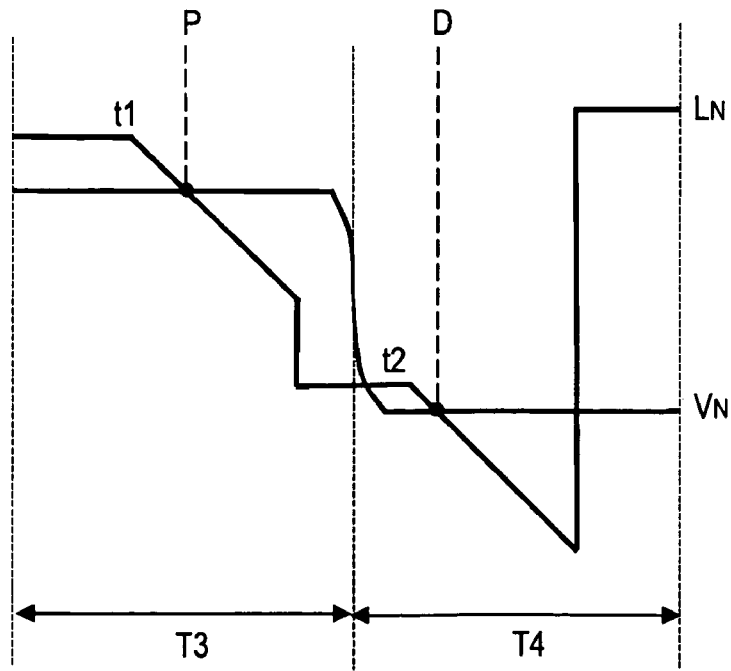

On the contrary, when the ramp wave $L_N$ is used to convert the pixel output value $V_N$ of the N-th row into a digital value, the P-phase reading period indicated by reference sign T3 in FIG. 10B is preferable for determining the count value of the reset level of the pixel output value $V_N$. The D-phase reading period indicated by reference sign T4 in FIG. 10B is preferable for determining the count value of the signal level of the pixel output value $V_N$.

"When the ramp wave $L_N$ is used to convert the pixel output value $V_N$ of the N-th row into a digital value" means a case where the range of the pixel output value of the N-th row is predicted from the pixel output value of the (N−1)-th row.

Here, when the reset level of the pixel output value of the N-th row is a high voltage equal to or higher than the predicted range d1 and has a voltage value higher than the initial voltage value $D_P$, no intersection with the ramp wave $L_N$ exists and thus it is not possible to determine the count value of the reset level.

In this case, by outputting the ramp wave counting down from the maximum voltage value (>initial voltage value) of the DAC 3, it may cope with the detection of the intersection with the reset level.

Similarly, when the signal level of the pixel output value of the N-th row is a high voltage equal to or higher than the predicted range d2 and has a voltage value higher than the initial voltage value $D_D$, no intersection with the ramp wave $L_N$ exists and thus it is not possible to determine the count value of the signal level.

In this case, by outputting the ramp wave counting down from the maximum voltage value (>initial voltage value) of the DAC 3, it may cope with the detection of the intersection with the signal level.

Figure 11:
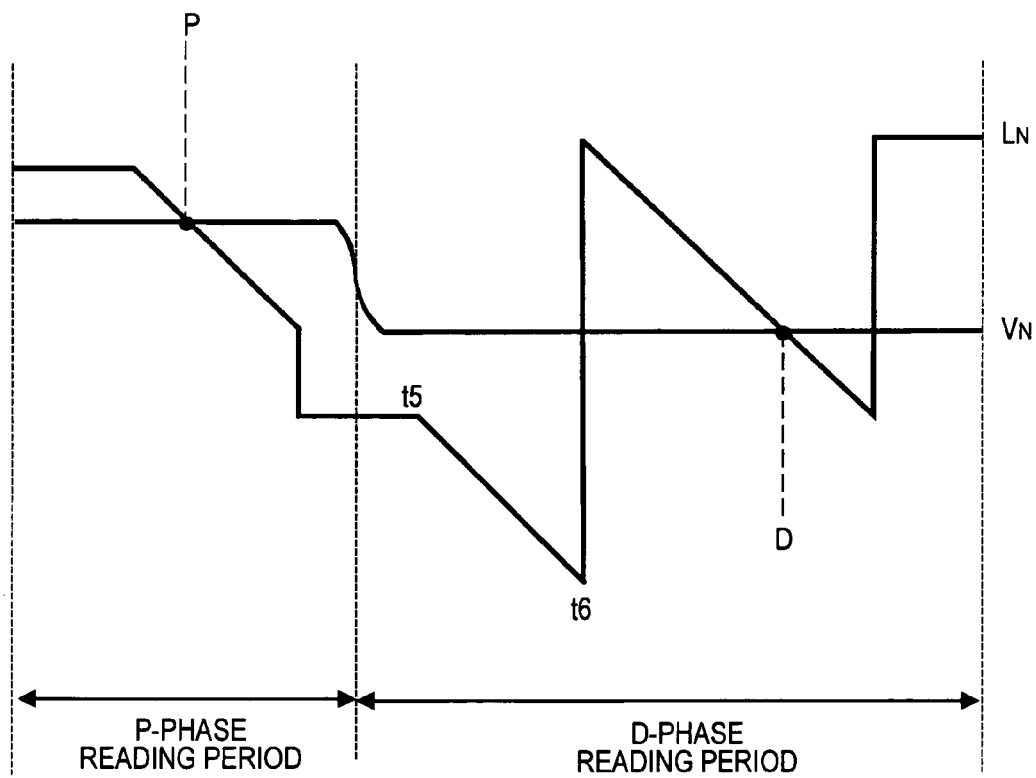
FIG. 11 is a diagram schematically illustrating an example where a down-count ramp wave is generated from the maximum voltage value of the DAC.

Specifically, as shown in FIG. 11, it is assumed to convert the signal level of the pixel output value of the N-th row into a digital value that the decrease of the ramp wave is started at the time indicated by reference sign t5 in FIG. 11 and the ramp wave reaches the minimum voltage value of the DAC without detecting the intersection of the ramp wave and the signal level. In this case, the ramp wave counting down from the maximum voltage value of the. DAC is output. Accordingly, the intersection D of the ramp wave and the signal level is detected, thereby determining the count value of the signal level of the pixel output value of the N-th row.

6. Modified Example of Second Embodiment

In the second embodiment, the case where the voltage value of the analog signal having the maximum voltage value among the analog signals converted into the digital signals by the ADCs at the previous time is stored in the memory 8 is exemplified. However, the initial voltage value may be stored in the memory 8 as long as the ramp wave at the subsequent time can be generated on the basis of the analog signals converted into the digital signals at the previous time. That is, the initial voltage value $D_P$ or $D_D$ obtained by adding the predetermined voltage d1 or d2 to the voltage value of the analog signal having the maximum voltage value may be stored in the memory.

In the second embodiment, the case where the signal charges generated from the pixels in the (N−1)-th row are read at the previous time and the signal charges generated from the pixels in the N-th row are read at the subsequent time is exemplified. However, the signal charges generated from the pixels in the (N−1)-th row need not be read at the previous time. That is, the signal charges generated from the pixels in the N-th row may be read at the previous time and the signal charges generated from the pixels in the (N−1)-th row may be read at the subsequent time.

In the second embodiment, the case where the range of the analog signal converted into the digital signal at the subsequent time is predicted from the adjacent pixels such as the pixels in the (N−1)-th row and the pixels in the N-th row is exemplified. However, the range of the analog signal need not be predicted from the adjacent pixels, but the range of the analog signal may be predicted from the pixels not adjacent to each other such as the pixels in the (N−3)-th row and the pixels in the N-th row. Here, since two adjacent pixels generally have a small difference, it is possible to further reduce the analog-digital conversion period by predicting the range of the analog signal on the basis of the adjacent pixels.

In the second embodiment, as described above, the case where the analog signal is predicted from the pixels in the same frame such as the pixels in the (N−1)-th row and the pixels in the N-th row is exemplified. However, the analog signal need not be predicted from the pixels in the same frame, but, for example, the analog signal of the same pixels in the subsequent frame may be predicted on the basis of the analog signal of the same pixels in the previous frame.

In the second embodiment, the case where the down-count ramp wave is used is exemplified. However, the down-count ramp wave need not be used, but the up-count ramp wave may be used. When the up-count ramp wave is used, a voltage value smaller by a predetermined voltage than the voltage value of the analog signal having the minimum voltage value among the analog signals converted into the digital signals at the previous time is used as the initial voltage.

7. Third Embodiment

Configuration of Camera

Figure 12:
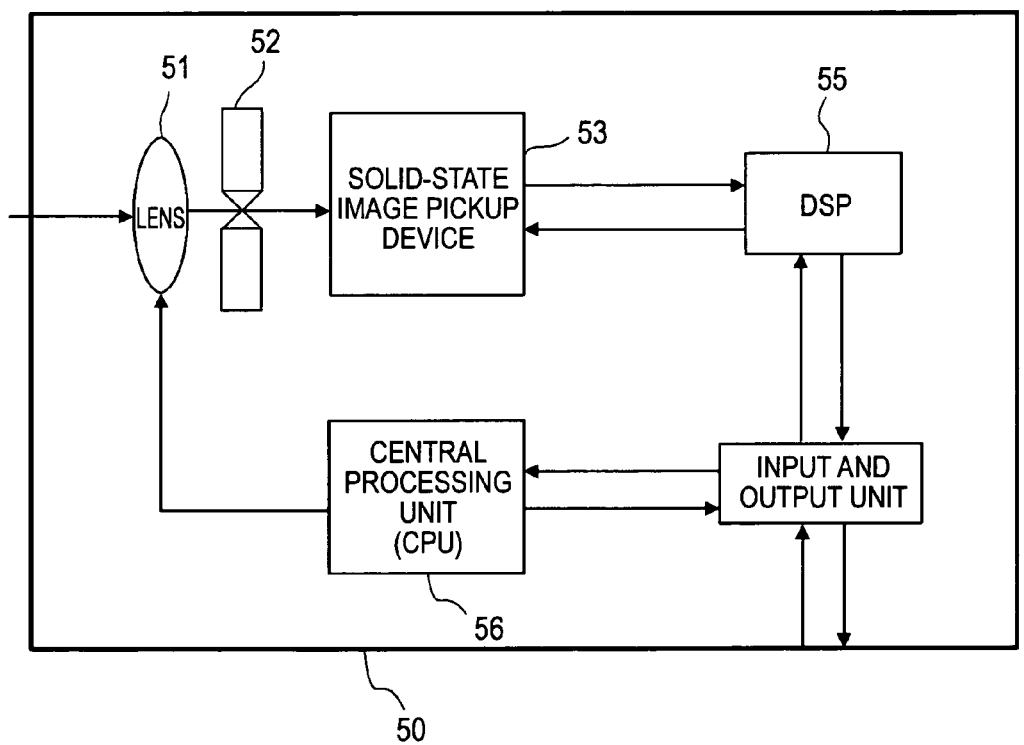
FIG. 12 is a diagram schematically illustrating a CMOS camera which is an example of a camera according to a third embodiment of the invention.
Figure 13:
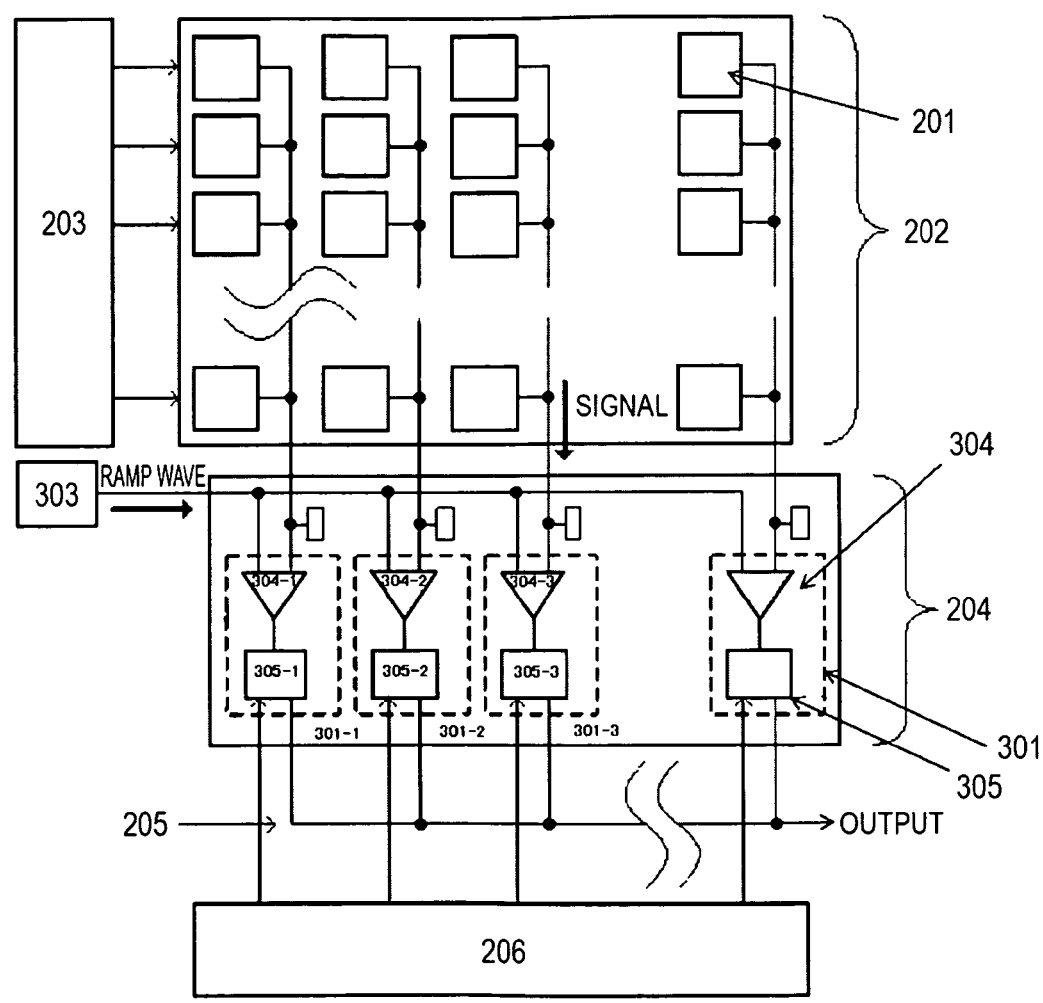
FIG. 13 is a diagram schematically illustrating a known CMOS image sensor.
Figure 14:
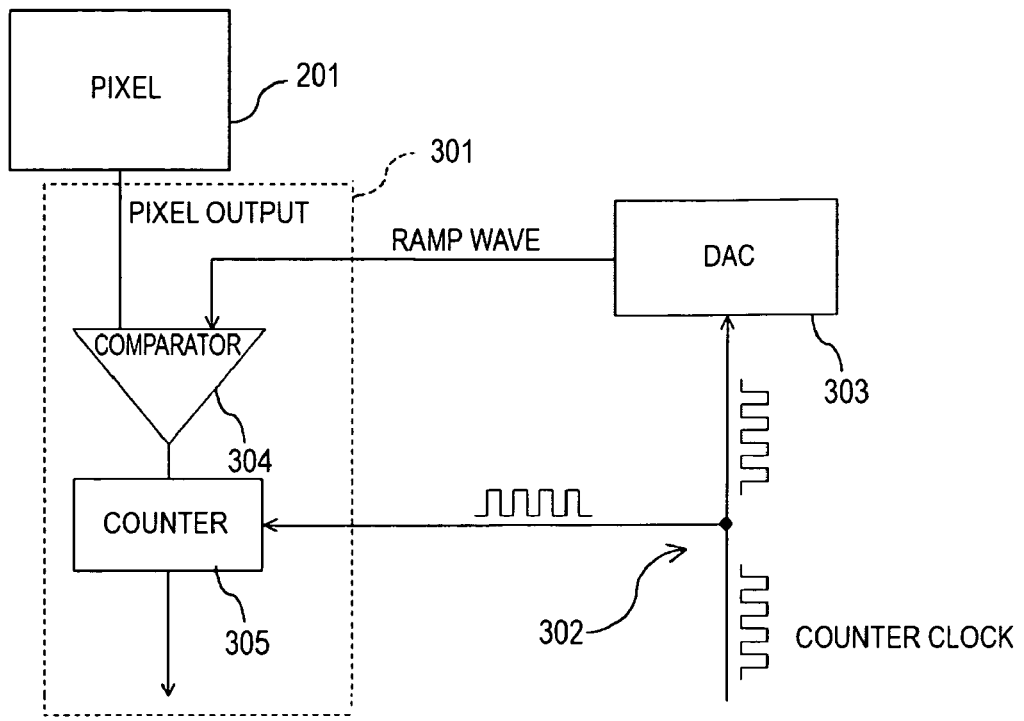
FIG. 14 is a diagram schematically illustrating a known ADC.
Figure 15:
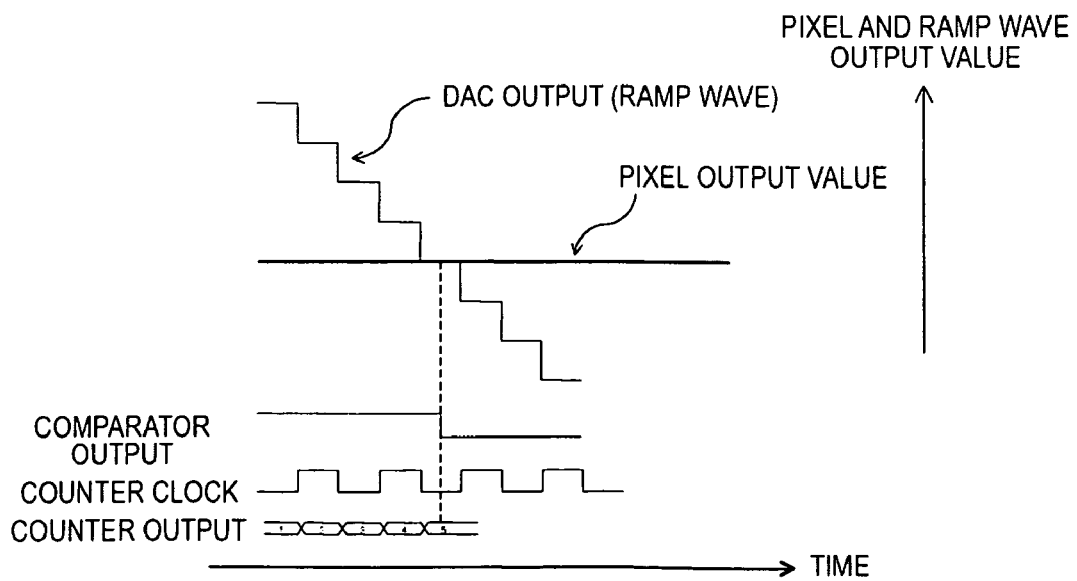
FIG. 15 is a diagram schematically illustrating a principle of the known ADC.
Figure 16:
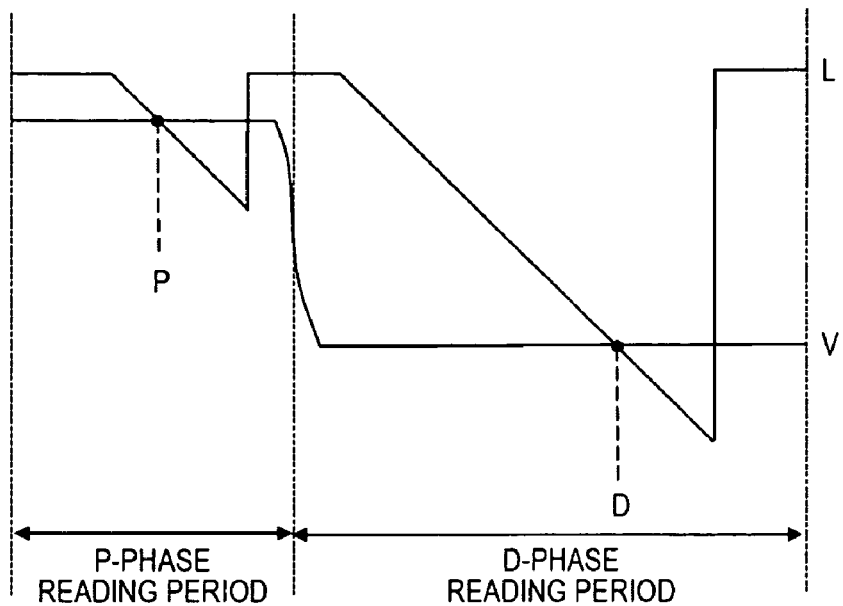
FIG. 16 is a diagram schematically illustrating a known analog-digital conversion process.
Figure 17:
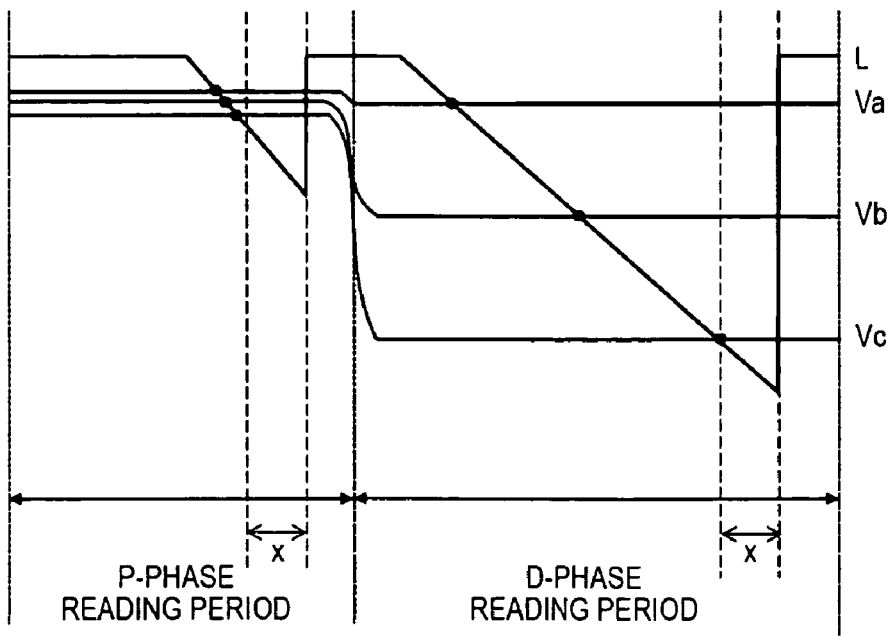
FIG. 17 is a diagram schematically illustrating an idle scanning period in the known analog-digital conversion process.

FIG. 12 is a diagram schematically illustrating a CMOS camera 50 which is an example of a camera according to a third embodiment of the invention. The CMOS camera 50 employs the CMOS image sensor according to the first embodiment as an image pickup device.

In the CMOS camera 50 according to the third embodiment of the invention, light is incident on an imaging area of the CMOS image sensor 53 via an optical system such as a lens 51 and a mechanical shutter 52. The mechanical shutter 52 serves to block the incidence of light on the imaging area of the CMOS solid-state image pickup device 53 and to determine an exposure time.

Here, the CMOS image sensor according to the first embodiment is used as the CMOS image sensor 53.

The output signal of the CMOS image sensor 53 is subjected to various signal processes such as an automatic white balance adjustment by a next-stage signal processor (digital signal processor (DSP)) 55 and then is output to the outside as an imaging signal. The opening and closing control of the mechanical shutter 52, the control of the DSP 55, and the like are carried out by a central processing unit (CPU) 56.

Since the CMOS camera 50 according to the third embodiment of the invention employs the CMOS image sensor according to the embodiments of the invention, it is possible to reduce the P-phase reading period and the D-phase reading period, thereby reducing the analog-digital conversion period.

The present application contains subject matter related to that disclosed in Japanese Priority Patent Application JP 2008-217595 and JP 2008-327145 filed in the Japan Patent Office on Aug. 27, 2008 and Dec. 24, 2008, respectively, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An analog-digital converter comprising:
   comparators disposed to correspond to analog signals which are converted into digital signals and configured to compare a voltage value of the analog signal, which is converted into the digital signal, with a voltage value of a predetermined reference signal;
   counters disposed to correspond to the comparators and configured to count a count value at the time point when the comparison process of the corresponding comparator is finished;
   a determiner configured to determine a time point when all the comparators finish their comparison processes; and
   a reference signal generator generating a down-count reference signal having as an initial voltage value a voltage value which is greater by a predetermined voltage than the voltage value of the analog signal having the maximum voltage value among the analog signals converted into the digital signals at a previous time or generating an up-count reference signal having as an initial voltage value a voltage value which is smaller by a predetermined voltage than that of the analog signal having the minimum voltage value among the analog signals converted into the digital signals at the previous time,
   wherein each comparator compares a voltage value of the analog signal, which is converted into the digital signal at a subsequent time, with the voltage value of the reference signal generated by the reference signal generator.

2. The analog-digital converter according to claim 1, wherein the reference signal generator generates the down-count reference signal from the maximum voltage value of the reference signal generator when the down-count reference signal reaches the minimum voltage value but the comparison processes of the comparators are not finished, or generates the up-count reference signal from the minimum voltage value of the reference signal generator when the up-count reference signal reaches the maximum voltage value but the comparison processes of the comparators are not finished.

3. An analog-digital converter comprising:
comparators disposed to correspond to analog signals which are converted into digital signals and configured to compare a voltage value of the analog signal, which is converted into the digital signal, with a voltage value of a predetermined reference signal;
counters disposed to correspond to the comparators and configured to count a count value at the time point when the comparison process of the corresponding comparator is finished;
a determiner configured to determine a time point when all the comparators finish their comparison processes;
a voltage value storage storing as a maximum voltage value the voltage value of the analog signal having the maximum voltage value among the analog signals converted into the digital signals at a previous time and storing as a minimum voltage value the voltage value of the analog signal having the minimum voltage value among the analog signals converted into the digital signals at the previous time; and
a reference signal generator generating a down-count reference signal having as an initial voltage value the voltage value which is greater by a predetermined voltage than the maximum voltage value stored in the voltage value storage or generating an up-count reference signal having as an initial voltage value the voltage value which is smaller by a predetermined voltage than the minimum voltage value stored in the voltage value storage,
wherein each comparator compares the voltage value of the analog signal, which is converted into the digital signal at a subsequent time, with the voltage value of the reference signal generated by the reference signal generator.

4. An analog-digital converter comprising:
comparators disposed to correspond to analog signals which are converted into digital signals and configured to compare a voltage value of the analog signal, which is converted into the digital signal, with a voltage value of a predetermined reference signal;
counters disposed to correspond to the comparators and configured to count a count value at the time point when the comparison process of the corresponding comparator is finished;
a determiner configured to determine a time point when all the comparators finish their comparison processes,
a voltage value storage storing as a maximum voltage value a voltage value which is greater by a predetermined voltage than the voltage value of the analog signal having the maximum voltage value among the analog signals converted into the digital signals at a previous time and storing as a minimum voltage value a voltage value which is smaller by a predetermined voltage than the voltage value of the analog signal having the minimum voltage value among the analog signals converted into the digital signals at the previous time; and
a reference signal generator generating a down-count reference signal having as an initial voltage value the maximum voltage value stored in the voltage value storage or generating an up-count reference signal having as an initial voltage value the minimum voltage value stored in the voltage value storage,
wherein each comparator compares the voltage value of the analog signal, which is converted into the digital signal at a subsequent time, with the voltage value of the reference signal generated by the reference signal generator.

5. An image pickup device comprising:
a pixel array section in which pixels accumulating an analog signal corresponding to incident light are arranged in a matrix;
comparators disposed to correspond to the pixels to be subjected to a reading operation and configured to compare a voltage value of the analog signal generated from the pixel subjected to the reading operation with a voltage value of a predetermined reference signal;
counters disposed to correspond to the comparators and configured to count a count value at the time point when the comparison process of the corresponding comparator is finished;
a determiner configured to determine a time point when all the comparators finish their comparison processes; and
a reference signal generator generating a down-count reference signal having as an initial voltage value a voltage value which is greater by a predetermined voltage than the voltage value of the analog signal having the maximum voltage value among the analog signals generated from the pixels subjected to the reading operation at a previous time or generating an up-count reference signal having as an initial voltage value a voltage value which is smaller by a predetermined voltage than that of the analog signal having the minimum voltage value among the analog signals generated from the pixels subjected to the reading operation at the previous time,
wherein each comparator compares a voltage value of the analog signal, which is generated from the pixels subjected to the reading operation at a subsequent time, with the voltage value of the reference signal generated by the reference signal generator.

6. An image pickup device comprising:
a pixel array section in which pixels accumulating an analog signal corresponding to incident light are arranged in a matrix;
comparators disposed to correspond to the pixels to be subjected to a reading operation and configured to compare a voltage value of the analog signal generated from the pixel subjected to the reading operation with a voltage value of a predetermined reference signal;
counters disposed to correspond to the comparators and configured to count a count value at the time point when the comparison process of the corresponding comparator is finished;
a determiner configured to determine a time point when all the comparators finish their comparison processes;
a voltage value storage storing as a maximum voltage value the voltage value of the analog signal having the maximum voltage value among the analog signals generated from the pixels subjected to the reading operation at a previous time and storing as a minimum voltage value the voltage value of the analog signal having the minimum voltage value among the analog signals generated from the pixels subjected to the reading operation at the previous time; and
a reference signal generator generating a down-count reference signal having as an initial voltage value the voltage value which is greater by a predetermined voltage than the maximum voltage value stored in the voltage value storage or generating an up-count reference signal having as an initial voltage value the voltage value which is smaller by a predetermined voltage than the minimum voltage value stored in the voltage value storage, wherein each comparator compares the voltage value of the analog signal, which is generated from the pixels subjected to the reading operation at a subsequent time, with the voltage value of the reference signal generated by the reference signal generator.

7. An image pickup device comprising:

a pixel array section in which pixels accumulating an analog signal corresponding to incident light are arranged in a matrix;

comparators disposed to correspond to the pixels to be subjected to a reading operation and configured to compare a voltage value of the analog signal generated from the pixel subjected to the reading operation with a voltage value of a predetermined reference signal;

counters disposed to correspond to the comparators and configured to count a count value at the time point when the comparison process of the corresponding comparator is finished;

a determiner configured to determine a time point when all the comparators finish their comparison processes;

a voltage value storage storing as a maximum voltage value a voltage value which is greater by a predetermined voltage than the voltage value of the analog signal having the maximum voltage value among the analog signals generated from the pixels subjected to the reading operation at a previous time and storing as a minimum voltage value a voltage value which is smaller by a predetermined voltage than the voltage value of the analog signal having the minimum voltage value among the analog signals generated from the pixels subjected to the reading operation at the previous time; and a reference signal generator generating a down-count reference signal having as an initial voltage value the maximum voltage value stored in the voltage value storage or generating an up-count reference signal having as an initial voltage value the minimum voltage value stored in the voltage value storage, wherein each comparator compares the voltage value of the analog signal, which is generated from the pixels subjected to the reading operation at a subsequent time, with the voltage value of the reference signal generated by the reference signal generator.

8. The image pickup device according to any one of claims 5 to 7, wherein the pixels subjected to the reading operation at the subsequent time are adjacent to the pixels subjected to the reading operation at the previous time.

9. The image pickup device according to any one of claims 5 to 7, wherein the pixels subjected to the reading operation at the subsequent. time are the same as the pixels subjected to the reading operation at the previous time.

10. A camera comprising:

the image pickup device according to any one of claims 5 to 7; and an optical system guiding the incident light to the pixel array section.

11. The analog-digital converter according to any one of claims 1 to 4, wherein each comparator outputs an output signal, and the determiner determines the time point when all comparators finish their comparison process by determining the time point when all output signals have inversed.

12. The image pickup device according to any one of claims 5 to 7, wherein each comparator outputs an output signal, and the determiner determines the time point when all comparators finish their comparison process by determining the time point when all output signals have inversed.

13. The camera according to claim 10, wherein each comparator outputs an output signal, and the determiner determines the time point when all comparators finish their comparison process by determining the time point when all output signals have inversed.

\* \* \* \* \*